US010121783B2

(12) United States Patent
Kanno et al.

(10) Patent No.: US 10,121,783 B2
(45) Date of Patent: Nov. 6, 2018

(54) SEMICONDUCTOR INTEGRATED CIRCUIT AND SEMICONDUCTOR MODULE

(71) Applicant: Fuji Electric Co., Ltd., Kanagawa (JP)

(72) Inventors: Hiroshi Kanno, Nagano (JP);
Masaharu Yamaji, Nagano (JP);
Akihiro Jonishi, Blacksburg, VA (US)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/641,604

(22) Filed: Jul. 5, 2017

(65) Prior Publication Data

US 2018/0061827 A1   Mar. 1, 2018

(30) Foreign Application Priority Data

Aug. 29, 2016   (JP) .................................. 2016-166804

(51) Int. Cl.
  *H01L 27/07*   (2006.01)
  *H01L 21/768*  (2006.01)
  *H01L 29/06*   (2006.01)
  *H03K 17/687*  (2006.01)

(52) U.S. Cl.
  CPC .... *H01L 27/0727* (2013.01); *H01L 21/76897* (2013.01); *H01L 29/0649* (2013.01); *H03K 17/6872* (2013.01); *H03K 2217/0063* (2013.01); *H03K 2217/0072* (2013.01)

(58) Field of Classification Search
  CPC ............. H01L 27/0727; H01L 29/0649; H01L 21/76897; H03K 17/6872; H03K 2217/0063; H03K 2217/0072

USPC .......................................................... 257/371
See application file for complete search history.

(56) References Cited

U.S. PATENT DOCUMENTS

| 5,939,755 A * | 8/1999 | Takeuchi ............ H01L 27/1203 257/347 |
| 2011/0221063 A1* | 9/2011 | Ichinose ........... H01L 21/76898 257/751 |
| 2015/0364470 A1* | 12/2015 | Yamaji ................ H01L 27/0921 257/372 |
| 2016/0043067 A1* | 2/2016 | Yamaji .................. H01L 21/761 257/357 |

FOREIGN PATENT DOCUMENTS

JP   2015-088607 A   5/2015

* cited by examiner

Primary Examiner — Marcos D Pizarro
Assistant Examiner — Sue Tang
(74) Attorney, Agent, or Firm — Chen Yoshimura LLP

(57) ABSTRACT

A semiconductor integrated circuit includes a semiconductor substrate of a first conductivity type, a first well region of a second conductivity type formed in an upper portion of the semiconductor substrate, a second well region of the first conductivity type formed in an upper portion of the first well region, an insulating layer formed separated from the first well region on a bottom portion of the semiconductor substrate that is directly beneath the first well region, and a rear surface electrode layer formed on a bottom of the insulating layer.

6 Claims, 8 Drawing Sheets

SEMICONDUCTOR INTEGRATED CIRCUIT AND SEMICONDUCTOR MODULE

BACKGROUND OF THE INVENTION

Technical Field

The present invention relates to a semiconductor integrated circuit, and more particularly to a power semiconductor integrated circuit including a high-voltage IC (hereinafter, "HVIC") that can be used as a control IC for a power switching element, as well as to a semiconductor module equipped with this semiconductor integrated circuit.

Background Art

In conventional low-power inverters, the switching elements in power conversion bridge circuits are primarily driven using HVICs. An HVIC typically includes components such as a high-side driver circuit, a low-side driver circuit, a level shifter, and a control circuit. The HVIC is connected to a switching element on the high-voltage side of the power conversion bridge circuit and outputs, from an output terminal and in accordance with a signal input to an input terminal, a drive signal for switching the gate of the switching element ON and OFF, for example. In such a power conversion bridge circuit, power is converted as this high-voltage side switching element that receives the signal from the HVIC is switched ON and OFF.

During the power conversion process in the power conversion bridge circuit, an extremely wide range of voltages (ranging from negative voltages to as many as several hundred volts, for example) are applied to the HVIC, thereby resulting in various types of noise being input to the HVIC. This can potentially cause the HVIC to malfunction, become inoperable, suffer damage, or the like. Therefore, when designing HVICs, it is critical to achieve noise tolerance against such noise in order to improve reliability.

One previously disclosed technology for improving the reliability of semiconductor integrated circuits involves mounting a high-voltage IC chip on a circuit board island (die pad) with an insulating adhesive interposed therebetween (see Patent Document 1). In Patent Document 1, the high-voltage IC chip is electrically insulated from the island by the insulating adhesive, and therefore even when a parasitic transistor switches ON and creates a short-circuit that allows through current to flow in the vertical direction of the semiconductor substrate, the through current does not flow to the island side. However, in Patent Document 1, the adhesion between the insulating adhesive layer and the metallic island is not given adequate consideration, thereby resulting in weak bond integrity when the high-voltage IC chip is bonded to the circuit board to form a module.

RELATED ART DOCUMENT

Patent Document

Patent Document 1: Japanese Patent Application Laid-Open Publication No. 2015-088607

SUMMARY OF THE INVENTION

The present invention was made in view of the above-mentioned problems and aims to provide a semiconductor integrated circuit that exhibits improved reliability while also making it possible to increase bond integrity when forming a module, as well as a semiconductor module equipped with this semiconductor integrated circuit. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor integrated circuit, including: a semiconductor substrate of a first conductivity type; a first well region of a second conductivity type formed in an upper portion of the semiconductor substrate; a second well region of the first conductivity type formed in an upper portion of the first well region; an insulating layer formed separated from the first well region on a bottom portion of the semiconductor substrate directly beneath the first well region; and a rear surface electrode layer formed below the insulating layer.

In one aspect, the present disclosure provides a semiconductor module, including: a semiconductor integrated circuit including a semiconductor substrate of a first conductivity type, a first well region of a second conductivity type formed in an upper portion of the semiconductor substrate, a second well region of the first conductivity type formed in an upper portion of the first well region, an insulating layer formed separated from the first well region on a bottom portion of the semiconductor substrate directly beneath the first well region, and a rear surface electrode layer formed below the insulating layer; an insulated circuit board having formed on a surface thereof a conductive layer on which to mount the semiconductor integrated circuit; and a bonding layer that is interposed between the conductive layer and the rear surface electrode layer and bonds together the rear surface electrode layer and the conductive layer.

The present invention therefore makes it possible to provide a semiconductor integrated circuit that exhibits improved reliability while also making it possible to increase bond integrity when forming a module, as well as a semiconductor module equipped with this semiconductor integrated circuit. It is to be understood that both the foregoing general description and the following detailed description are exemplary and explanatory, and are intended to provide further explanation of the invention as claimed.

DETAILED DESCRIPTION OF EMBODIMENTS

Figure 1:
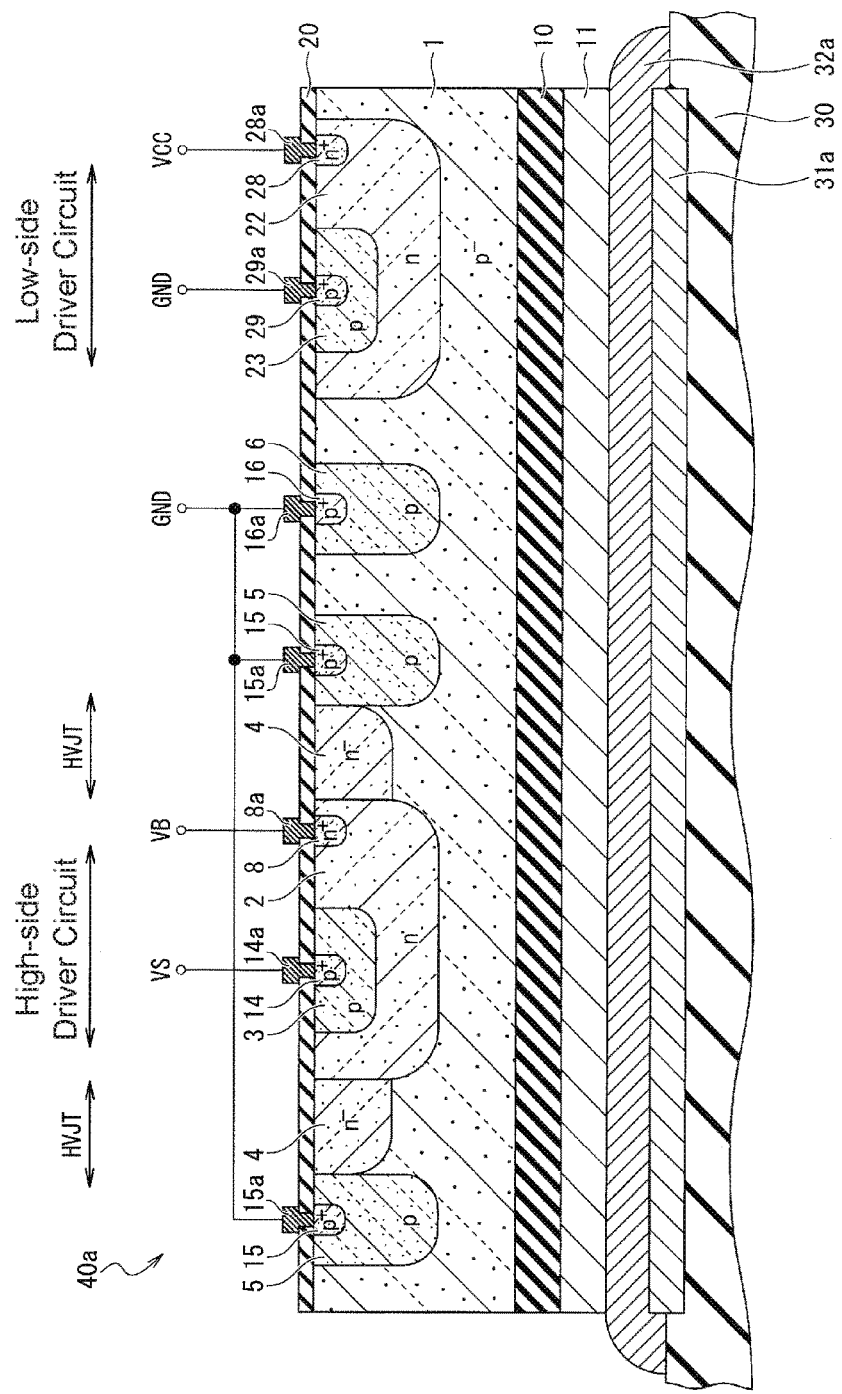
FIG. 1 is a cross-sectional view schematically illustrating an overall configuration of a semiconductor integrated circuit according to an embodiment of the present invention.

Next, an embodiment of the present invention will be described. In the figures described below, the same or similar reference characters are used for components that are the same or similar. Note, however, that the figures are only intended to be schematic illustrations, and the relationships between thickness and planar dimensions, the proportions between the thicknesses of each device and each component, and the like may be different from the actual devices. Therefore, specific thicknesses and dimensions should be determined by referring to the descriptions below. Similarly, the illustrated dimensional relationships and proportions of components in the figures may differ from one figure to the next.

Moreover, in the following descriptions, the "left and right" and the "up and down" directions are defined only for the purposes of convenience and do not limit the technical concepts of the present invention in any way. Therefore, the figures may be rotated by 90° such that the "left and right" and the "up and down" directions are interchanged, or the figures may be rotated by 180° such that the "left" direction becomes the "right" direction and the "right" direction becomes the "left" direction, for example.

In addition, in the present specification, the terms "first main electrode region" and "third main electrode region" refer to one semiconductor region among the source region and the drain region in a field-effect transistor (FET) or a static induction transistor (SIT). In an insulated-gate bipolar transistor (IGBT), these terms refer to one semiconductor region among the emitter region and the collector region, and in a static induction thyristor (SI thyristor) or a gate turn-off thyristor (GTO), these terms refer to one semiconductor region among the anode region and the cathode region.

Meanwhile, the terms "second main electrode region" and "fourth main electrode region" refer to the semiconductor region among the source region and the drain region that does not correspond to the first main electrode region for a FET or a SIT, to the region among the emitter region and the collector region that does not correspond to the first main electrode region for an IGBT, and to the region among the anode region and the cathode region that does not correspond to the first main electrode region and the third main electrode region for an SI thyristor or a GTO.

Moreover, although the following descriptions assume that the "first conductivity type" is p-type and that the "second conductivity type" is n-type as an example, the conductivity types may be selected in the opposite manner such that the first conductivity type is n-type and the second conductivity type is p-type. Furthermore, in the present specification and attached drawings, the symbols + and − are appended to the letters n and p to indicate that the corresponding semiconductor region has a higher or lower impurity concentration, respectively, than a semiconductor region for which the symbols + and − are not appended to the letters n and p. Here, even when regions have the same notation (such as when two regions are both labeled as n$^+$), this does not necessarily imply that those regions have exactly the same impurity concentrations.

(Configuration of Semiconductor Integrated Circuit)

A semiconductor integrated circuit 40a according to an embodiment of the present invention is an HVIC for use in a relatively low-power inverter or the like and is also a control IC for a power conversion bridge circuit that can withstand voltages of approximately 600V to 1200V during operation, for example. As illustrated in FIG. 1, the semiconductor integrated circuit 40a includes a low impurity concentration semiconductor substrate 1 of a first conductivity type (p$^−$) and a first well region 2 of a second conductivity type (n-type) that is formed in an upper portion of the semiconductor substrate 1 (as illustrated towards the upper left side in FIG. 1).

The semiconductor integrated circuit 40a according to the embodiment of the present invention further includes a p-type second well region 3 formed in an upper portion of the first well region 2, an insulating layer 10 that is formed on the bottom of the semiconductor substrate 1 directly beneath the first well region 2 and is thus separated from the first well region 2, and a rear surface electrode layer 11 formed on the bottom of the insulating layer 10. Furthermore, as illustrated on the upper right side of FIG. 1, the semiconductor integrated circuit 40a also includes an n-type third well region 22 formed in an upper portion of the semiconductor substrate 1 that is separated from the first well region 2, as well as a p-type fourth well region 23 formed in an upper portion of the third well region 22.

A relatively low-concentration n-type (n$^−$) breakdown voltage region 4 is formed around the periphery of the first well region 2. Moreover, a p-type first isolation region 5 and a p-type second isolation region 6 are formed between the first well region 2 and the third well region 22. In other words, the semiconductor integrated circuit 40a according to the embodiment of the present invention is manufactured using both a self-isolation technology and a junction isolation technology on the semiconductor substrate 1. Here, the second isolation region 6 is not necessarily required.

The semiconductor substrate 1 is a monocrystalline silicon (Si) bulk substrate with a resistivity of greater than or equal to approximately 100 Ω·cm, for example. A high-concentration n-type (n$^+$) first contact region 8 is selectively formed separated from the second well region 3 in an upper portion of the first well region 2. A first contact electrode 8a is formed on the upper surface of the first contact region 8, with a conductive plug that is formed going through an interlayer insulating film 20 interposed therebetween. The conductive plug is not labeled with a reference character in the figure.

Figure 2:
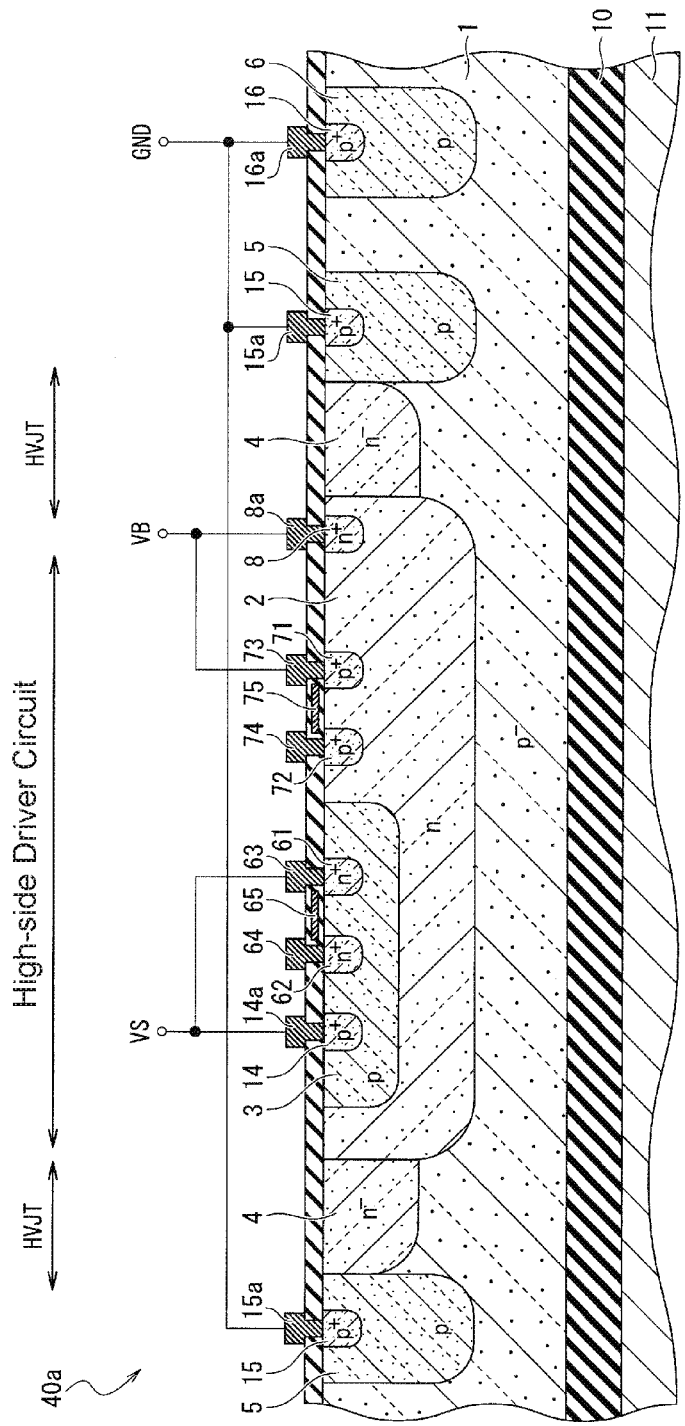
FIG. 2 is another cross-sectional view of the semiconductor integrated circuit taken along a different plane that includes a pMOSFET and nMOSFET structure, thus schematically illustrating an overall configuration of a high-side driver circuit in the semiconductor integrated circuit according to the embodiment of the present invention.

As illustrated in FIG. 2, a high-concentration n-type first main electrode region (source region) 61 and second main electrode region (drain region) 62 are respectively formed in an upper portion of the second well region 3. A source electrode 63 and a drain electrode 64 are respectively formed on the upper surfaces of the source region 61 and the drain region 62 in the second well region 3, with conductive plugs that are formed going through the interlayer insulating film 20 respectively interposed therebetween. Moreover, a gate electrode 65 is formed within the interlayer insulating film 20 above a portion of the second well region 3 that is positioned between the source region 61 and the drain region 62, with a gate insulating film interposed between the gate electrode 65 and the second well region 3, thereby forming a pMOSFET. The gate insulating film is not labeled with a reference character in the figure.

Furthermore, a high-concentration p-type third main electrode region (source region) 71 and fourth main electrode region (drain region) 72 are respectively formed in an upper portion of the first well region 2 at a position separated from the second well region 3. A source electrode 73 and a drain electrode 74 are respectively formed on the upper surfaces of the source region 71 and the drain region 72 in the first well region 2, with conductive plugs that are formed going through the interlayer insulating film 20 respectively interposed therebetween. Moreover, a gate electrode 75 is formed within the interlayer insulating film 20 above a portion of the first well region 2 that is positioned between the source region 71 and the drain region 72, with a gate insulating film interposed between the gate electrode 75 and the first well region 2, thereby forming an nMOSFET.

The CMOS circuit constituted by the nMOSFET in the first well region 2 and the pMOSFET in the second well region 3 forms a high-side driver circuit. A voltage VB is applied to the first contact electrode 8a, and a voltage VS is applied to a second contact electrode 14a. This high-side driver circuit operates using the VS voltage as a reference voltage and the VB voltage as a supply voltage.

A second contact region 14 is selectively formed in an upper portion of the second well region 3. Similar to the first contact electrode 8a, the second contact electrode 14a is formed on the upper surface of the second contact region 14, with a conductive plug that is formed going through the interlayer insulating film 20 interposed therebetween.

The first well region 2 is a semiconductor layer in which an n-type impurity element such as phosphorous (P) has been diffused into the upper surface side of the semiconductor substrate 1 to a relatively deep depth, for example. Here, the impurity concentration of the first well region 2 is approximately $1.0 \times 10^{14}/cm^3$ to $1.0 \times 10^{17}/cm^3$, for example. The second well region 3 is a semiconductor layer in which a p-type impurity element such as boron (B) has been diffused into the upper surface side of the semiconductor substrate 1 to a relatively shallow depth, for example. Here, the impurity concentration of the second well region 3 is approximately $1.0 \times 10^{14}/cm^3$ to $1.0 \times 10^{18}/cm^3$, for example.

The first contact region 8 is a semiconductor layer of a higher n-type impurity concentration ($n^+$) than the first well region 2. The second contact region 14 is a semiconductor layer of a higher p-type impurity concentration ($p^+$) than the second well region 3. A conductive film such as an aluminum (Al) film can be used for the first contact electrode 8a and the second contact electrode 14a, for example.

The p-type fourth well region 23 is formed in an upper portion of the third well region 22. A high-concentration n-type ($n^+$) third contact region 28 is selectively formed separated from the fourth well region 23 in an upper portion of the third well region 22. A third contact electrode 28a is formed on the upper surface of the third contact region 28, with a conductive plug that is formed going through the interlayer insulating film 20 interposed therebetween.

Furthermore, although these structures are not illustrated in the figures, an nMOSFET is formed in the third well region 22 at a position separated from the fourth well region 23, and a pMOSFET is formed in the fourth well region 23, thereby forming a CMOS circuit similar to in the high-side driver circuit. The CMOS circuit in the third well region 22 forms a low-side driver circuit. In this low-side driver circuit, a voltage VCC is applied to the third contact electrode 28a, and a voltage GND is applied to a fourth contact electrode 29a. The low-side driver circuit operates using the GND voltage as a reference voltage and the VCC voltage as a supply voltage.

A fourth contact region 29 is selectively formed in an upper portion of the fourth well region 23. Similar to the third contact electrode 28a, the fourth contact electrode 29a is formed on the upper surface of the fourth contact region 29, with a conductive plug that is formed going through the interlayer insulating film 20 interposed therebetween.

Similar to the first well region 2, the third well region 22 is a semiconductor layer in which an n-type impurity element such as phosphorous (P) has been diffused into the upper surface side of the semiconductor substrate 1 to a relatively deep depth. Here, the impurity concentration of the third well region 22 is approximately $1.0 \times 10^{14}/cm^3$ to $1.0 \times 10^{17}/cm^3$, for example. Similar to the second well region 3, the fourth well region 23 is a semiconductor layer in which a p-type impurity element such as boron (B) has been diffused into the upper surface side of the semiconductor substrate 1 to a relatively shallow depth. Here, the impurity concentration of the fourth well region 23 is approximately $1.0 \times 10^{14}/cm^4$ to $1.0 \times 10^{18}/cm^3$, for example.

The third contact region 28 is a semiconductor layer of a higher n-type impurity concentration ($n^+$) than the third well region 22. The fourth contact region 29 is a semiconductor layer of a higher p-type impurity concentration ($p^+$) than the fourth well region 23. Similar to with the first contact electrode 8a, an Al film or the like can be used for both the third contact electrode 28a and the fourth contact electrode 29a, for example. Note that for convenience, components such as a passivation film that is positioned on top of the interlayer insulating film 20 formed on the upper surface of the semiconductor substrate 1 are not illustrated in FIG. 1.

The breakdown voltage region 4 is formed in a ring-shaped or frame-shaped planar pattern surrounding the high-side driver circuit, for example. The impurity concentration of the breakdown voltage region 4 is set to be lower than that of the first well region 2 in the high-side driver circuit.

Similar to the breakdown voltage region 4, the first isolation region 5 is formed in a ring-shaped or frame-shaped planar pattern surrounding the high-side driver circuit, for example. The impurity concentration of the isolation region 5 is set to be higher than that of the semiconductor substrate 1. A high-concentration p-type ($p^+$) first isolated contact region 15 is formed in an upper portion of the first isolation region 5.

A first isolated contact electrode 15a is formed on the upper surface of the first isolated contact region 15, with a conductive plug that is formed going through the interlayer insulating film 20 interposed therebetween. Similar to the first contact electrode 8a, the first isolated contact electrode 15a is an Al film or the like, for example. The breakdown voltage region 4 and the first isolation region 5 form a high-voltage junction termination region (HVJT).

Similar to the first isolation region 5, the second isolation region 6 is formed separated from the first isolation region 5 and from the third well region 22 in the low-side driver circuit. A high-concentration p-type ($p^+$) second isolated contact region 16 is formed in an upper portion of the second isolation region 6. A second isolated contact electrode 16a is formed on the upper surface of the second isolated contact region 16, with a conductive plug that is formed going through the interlayer insulating film 20 interposed therebetween. Similar to the first isolated contact electrode 15a, the second isolated contact electrode 16a is an Al film or the like, for example. The first isolated contact electrode and the second isolated contact electrode are grounded.

The insulating layer 10 may be made of an insulator-containing film such as a silicon oxide film ($Si_xO_y$), a silicon nitride film ($Si_xN_y$), or a polyimide film, for example. In the semiconductor integrated circuit 40a according to the embodiment of the present invention, an $SiO_2$ film is used. The insulating layer 10 is arranged on the rear surface electrode layer 11 within the semiconductor substrate 1 in order to reduce the amount of current that flows through the rear surface electrode layer 11 to a parasitic element in the HVIC. The insulating layer 10 can be formed using a film formation technology such as plasma CVD or atmospheric pressure CVD, for example.

Figure 3:
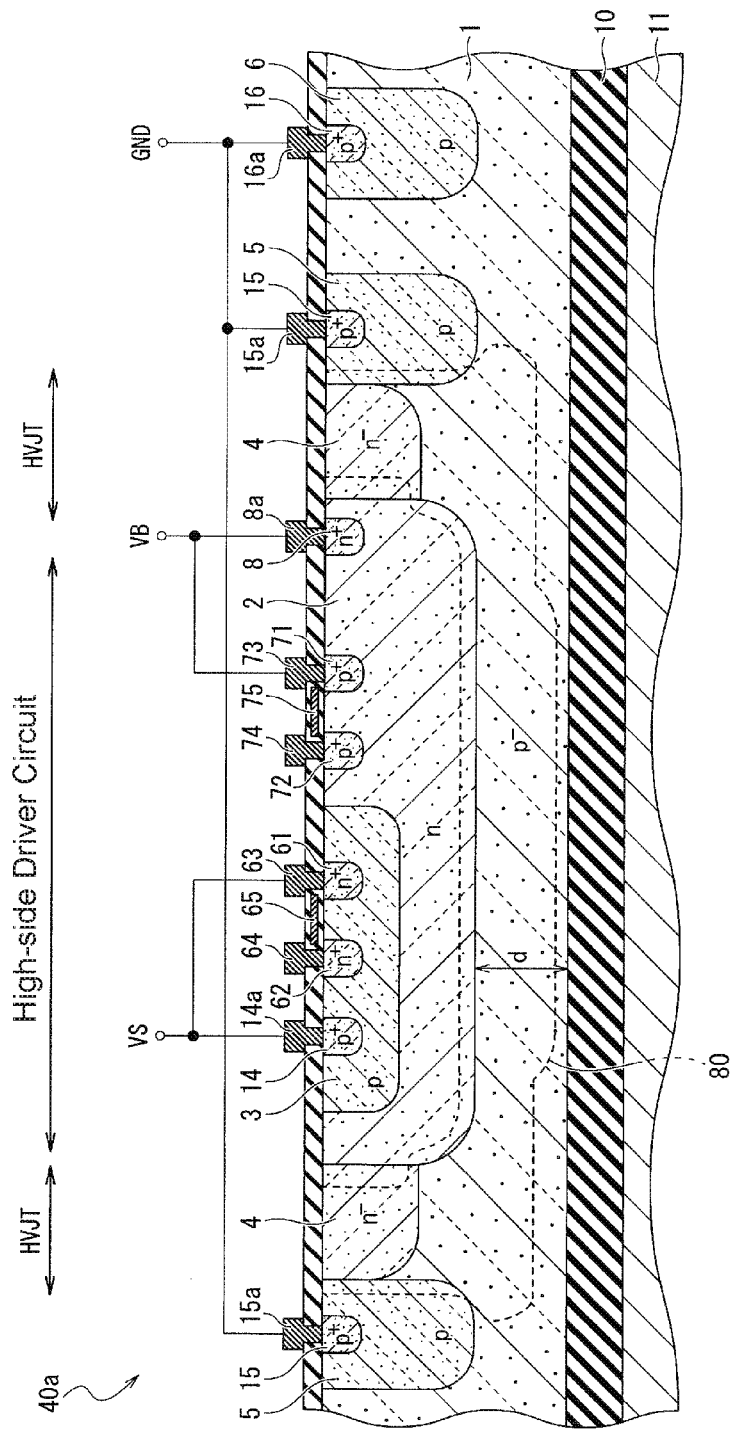
FIG. 3 is a cross-sectional view schematically illustrating how a depletion layer forms when a voltage VS and a voltage VB are applied to the high-side driver circuit in the semiconductor integrated circuit according to the embodiment of the present invention.

As illustrated in FIG. 3, a distance d between the first well region 2 and the insulating layer 10 is set such that a depletion layer 80 that expands out from the p-n junction between the semiconductor substrate 1 and the first well region 2 remains separated from the insulating layer 10. In FIG. 3, the dashed line indicates the depletion layer 80 that forms when the VB voltage is applied to the first well region 2 and the VS voltage is applied to the second well region 3. Note that here, if the possibility of a decrease in breakdown voltage is acceptable, a configuration in which the depletion layer 80 reaches the insulating layer 10 can alternatively be used.

Two of the main breakdown voltage classes for HVICs are the 600V class and the 1200V class. When the VS voltage is 600V, the thickness of the depletion layer is approximately 150 µm, and when the VS voltage is 1200V, the thickness of the depletion layer is approximately 200 µm. Therefore, it is preferable that the distance d between the bottom surface of the first well region 2 and the insulating layer 10 be set to greater than or equal to approximately 150 µm for a 600V application and be set to greater than or equal to approximately 200 µm for a 1200V application.

In other words, if the depth of the first well region 2 was approximately 10 µm, for example, it would be preferable that the thickness of the semiconductor substrate 1 be set to greater than or equal to approximately 160 µm for an HVIC in the 600V class. Similarly, for an HVIC in the 1200V class, it would be preferable that the thickness of the semiconductor substrate 1 be set to greater than or equal to approximately 210 µm.

The rear surface electrode layer 11 is formed over the entire rear surface of the HVIC using a method such as sputtering, for example. The rear surface electrode layer 11 functions as a buffer for increasing the bondability of the HVIC to an insulated circuit board 30. The rear surface electrode layer 11 includes an Al layer, a titanium (Ti) layer, a nickel (Ni) layer, and a gold (Au) layer. The Al layer, Ti layer, and Ni layer may also be constituted by alloy layers that are respectively composed primarily of aluminum, titanium, and nickel.

The Ti layer exhibits excellent adhesion with Si and also forms an electrical ohmic contact with Si. The Ni layer is used to form a bond with a bonding layer 32a on the bottom surface side. The Au layer is used to prevent oxidation of the Ni layer during the period until soldering is complete. The rear surface electrode layer 11 according to the embodiment of the present invention includes an Al layer in addition to the Ti layer, the Ni layer, and the Au layer, and these layers are formed in order from top to bottom to form an Al/Ti/Ni/Au layer.

Figure 4:
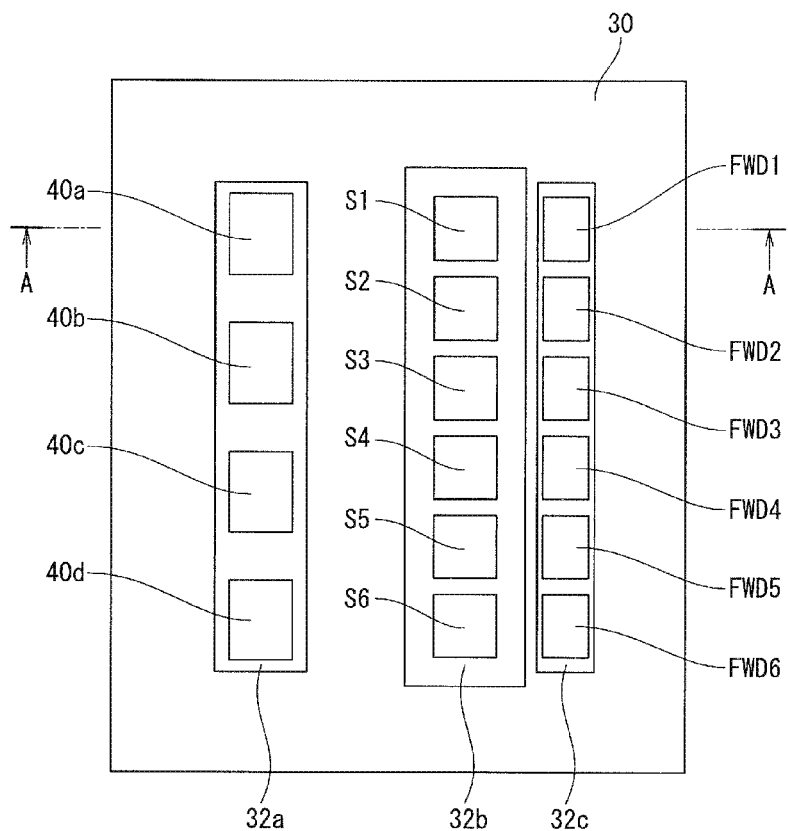
FIG. 4 is a plan view schematically illustrating an overall internal configuration of a semiconductor module equipped with the semiconductor integrated circuit according to the embodiment of the present invention in a state in which an upper case has been removed.

As illustrated in FIG. 1, the semiconductor integrated circuit 40a according to the embodiment of the present invention is mounted, via the bonding layer 32a, onto the insulated circuit board 30 (which has a conductor layer 31a (conductive layer) on the upper surface thereof). FIG. 4 illustrates an example in which four semiconductor integrated circuits 40a to 40d that are equivalent to the semiconductor integrated circuit 40a illustrated in FIG. 1 are mounted on the upper surface of the insulated circuit board 30.

Figure 5:
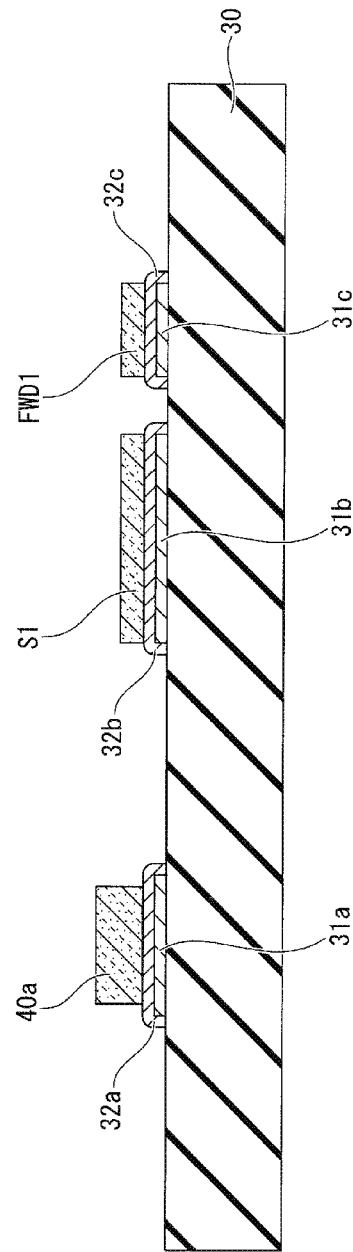
FIG. 5 is a cross-sectional view taken along line A-A in FIG. 4.

As illustrated in FIG. 5, the insulated circuit board 30 is a printed circuit board in which a plurality of conductor layers 31a to 31c (conductive layers) on which to arrange various elements are formed as circuit patterns. These elements are electrically connected to the conductor layers 31a to 31c via bonding layers 32a to 32c. A conductive bonding material such as solder or a silver paste can be used for the bonding layers 32a to 32c. In the semiconductor integrated circuit according to the embodiment of the present invention, the bonding layers 32a to 32c is a solder layer.

As illustrated on the left side of FIG. 4, the four semiconductor integrated circuits 40a to 40d are arranged above the conductor layer 31a for the semiconductor integrated circuits 40a to 40d and mounted on the insulated circuit board 30 via the bonding layer 32a in order to control the operation of six switching elements S1 to S6. The six switching elements S1 to S6 are power IGBTs, and as illustrated on the right side of FIG. 4, are arranged above a conductor layer for the switching elements S1 to S6 and mounted on the insulated circuit board 30 via the bonding layer 32b in order to form a three-phase power conversion bridge circuit.

Six freewheeling diodes FWD1 to FWD6 that respectively correspond to the six switching elements S1 to S6 are arranged respectively connected thereto. Note, however, that the figure does not explicitly illustrate the bonding wires or circuit patterns for respectively connecting together the switching elements S1 to S6 and the freewheeling diodes FWD1 to FWD6.

As illustrated in FIGS. 4 and 5, the six freewheeling diodes FWD1 to FWD6 are arranged above the conductor layer 31c for the freewheeling diodes and mounted on the insulated circuit board 30 via the bonding layer 32c. The six switching elements S1 to S6 and the six freewheeling diodes FWD1 to FWD6 form a power conversion bridge circuit.

Mounting the semiconductor integrated circuits 40a to 40d, the switching elements S1 to S6, and the freewheeling diodes FWD1 to FWD6 on the single insulated circuit board 30 as described above produces an intelligent power module (IPM). As illustrated in FIG. 5, the conductor layer 31a for the semiconductor integrated circuit 40a, the conductor layer 31b for the switching element S1, and the conductor layer 31c for the freewheeling diode FWD1 all have substantially the same thickness. Therefore, the semiconductor integrated circuits 40a to 40d, the switching elements S1 to S6, and the freewheeling diodes FWD1 to FWD6 are all mounted at substantially the same height on the insulated circuit board 30.

Figure 6:
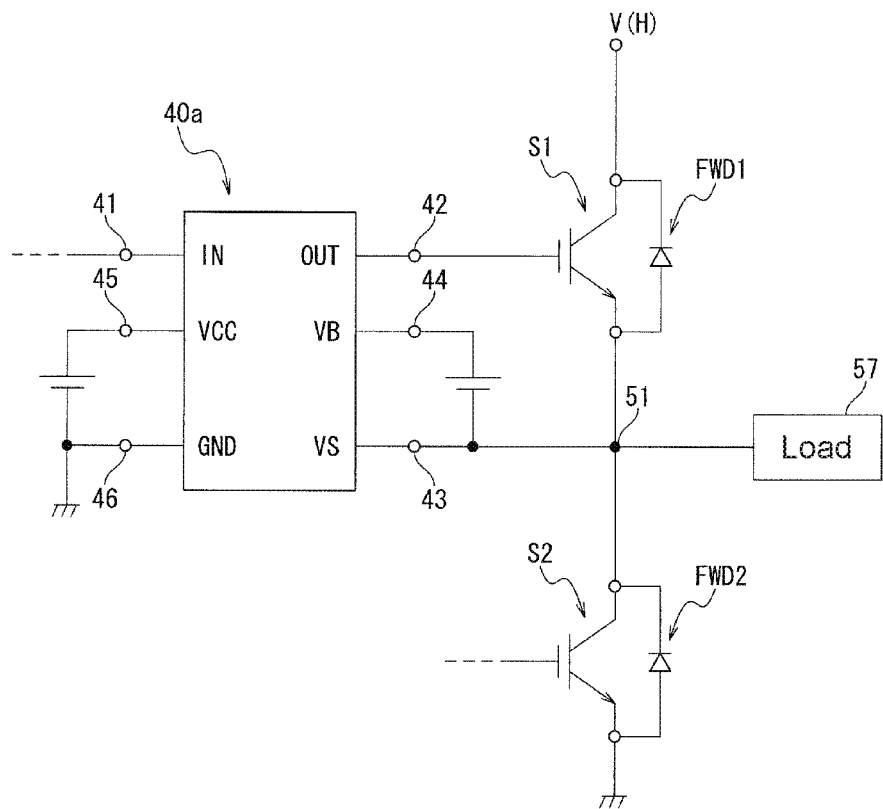
FIG. 6 is a circuit diagram schematically illustrating a configuration of a power converter to which the semiconductor integrated circuit according to the embodiment of the present invention is connected.

FIG. 6 illustrates the high-voltage side (high-side) switching element S1 and the low-voltage side (low-side) switching element S2, which together form a power converter that constitutes one phase of the bridge circuit. The high-voltage side switching element S1 and the low-voltage side switching element S2 are connected in series between a high-voltage main power supply V(H) (the positive side) and a ground voltage (GND) (the negative side of the main power supply V(H)).

The freewheeling diodes FWD1 and FWD2 are respectively connected in an anti-parallel manner to the high-voltage side switching element S1 and the low-voltage side switching element S2. The node 51 between the high-voltage side switching element S1 and the low-voltage side switching element S2 is the output point of the power converter. A motor or the like is connected to the node 51 as a load 57, for example.

As illustrated in FIG. 6, an input terminal 41, an output terminal 42, a VS terminal 43, a VB terminal 44, a VCC terminal 45, and a GND terminal 46 are connected to the semiconductor integrated circuit 40a. The input terminal 41 is connected to a microcomputer or the like (not illustrated in the figure), which inputs an input signal thereto. The output terminal 42 is connected to the gate of the high-voltage side switching element S1. The semiconductor integrated circuit 40a illustrated in FIG. 6 only drives the high-voltage side switching element S1 and thus functions as a driver circuit that does not drive the low-voltage side switching element S2.

The VB voltage is applied to the VB terminal 44 as a first voltage. The VB voltage is the maximum voltage applied to the semiconductor integrated circuit 40a. During the normal operation state in which no noise-related effects are present, the VB voltage is maintained approximately 15V higher than the VS voltage by a power supply such as a bootstrap capacitor that is connected to the VB terminal 44 and the VS terminal 43 of the semiconductor integrated circuit 40a.

The VS terminal 43 is connected to the node 51 between the high-voltage side switching element S1 and the low-voltage side switching element S2. The VS voltage is applied to the VS terminal 43 as a second voltage. During the power conversion process, the VS voltage ranges from 0V to several hundred volts, sometimes taking a negative value. The GND voltage is applied to the GND terminal 46. The GND voltage is the common voltage as well as the reference voltage for the semiconductor integrated circuit 40a. The VCC voltage is applied to the VCC terminal 45. The VCC voltage is the supply voltage for the semiconductor integrated circuit 40a.

The semiconductor integrated circuit 40a includes an internal control circuit (not illustrated in the figures) for generating a low-side level signal. The low-side level signal is generated from the GND voltage and the VCC voltage and is used to switch the high-voltage side switching element S1 ON and OFF. This low-side level signal is output via the low-side driver circuit illustrated on the right side of FIG. 1. Moreover, the high-side driver circuit illustrated on the left side in FIG. 1 is connected to the low-side driver circuit and outputs a drive signal from the output terminal 42 in accordance with the signal received from the low-side driver circuit.

Next, the operation of the semiconductor integrated circuit 40a according to the embodiment of the present invention will be described. First, immediately after the high-voltage side switching element S1 switches from ON to OFF, the VS terminal 43 takes a negative voltage that is less than the GND voltage. In some cases, this allows noise that can potentially cause the HVIC to malfunction, become inoperable, or suffer damage to be input. The negative voltage that is applied to the VS terminal 43 in this case will be referred to as a "negative voltage surge." The magnitude of this negative voltage surge increases as the magnitude of the current flowing through the switching element increases.

Therefore, in order to allow switching elements that handle high currents to be used, the resistance of the HVIC against such negative voltage surges must be improved.

Figure 7:
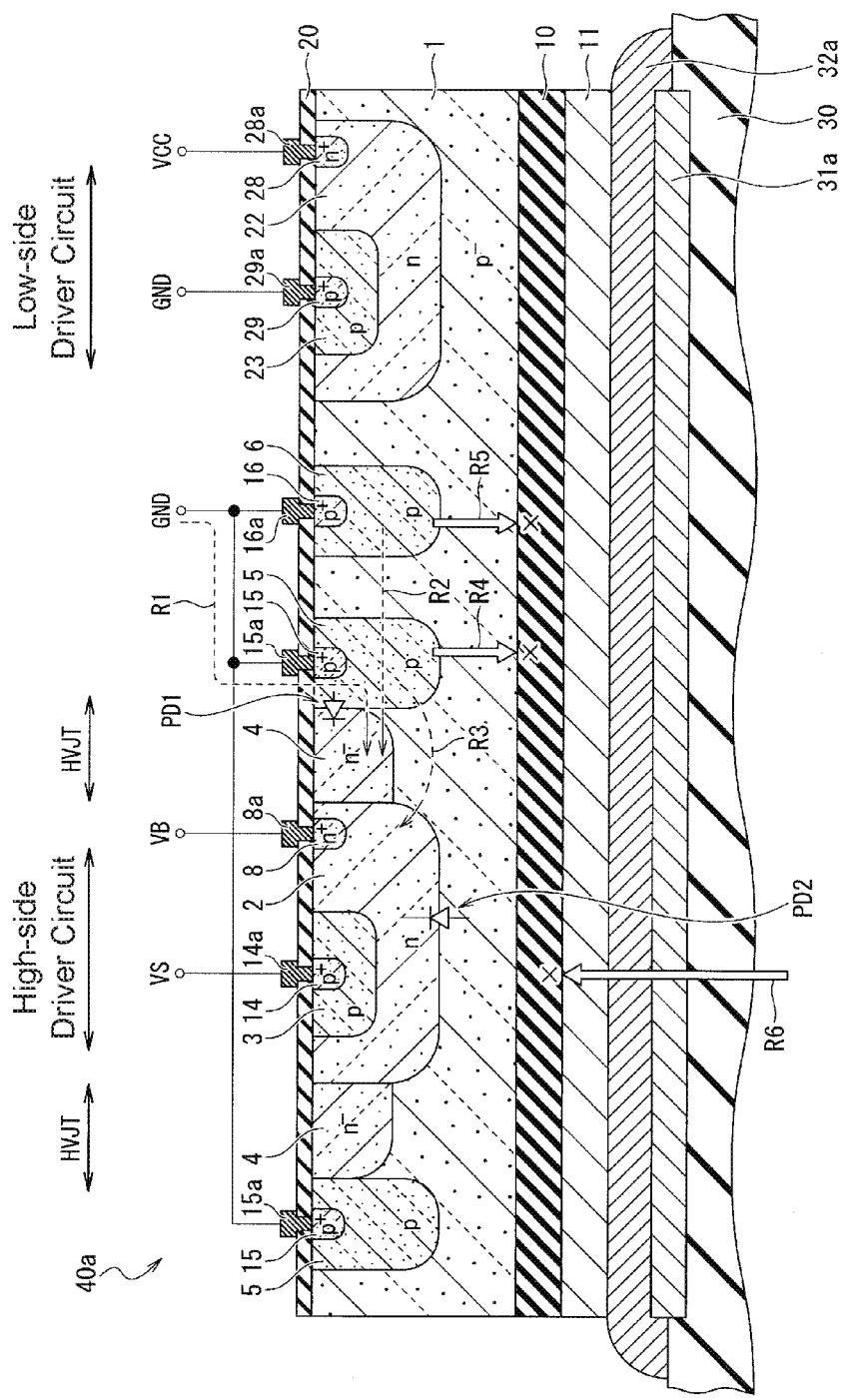
FIG. 7 is a cross-sectional view for explaining the flow of current through a parasitic element in the semiconductor integrated circuit according to the embodiment of the present invention.

Meanwhile, as illustrated in FIG. 7, in the semiconductor integrated circuit 40a according to the embodiment of the present invention (which utilizes a self-isolation technology), a first parasitic diode PD1 formed between the first isolation region 5 and the breakdown voltage region 4 as well as a second parasitic diode PD2 formed between the semiconductor substrate 1 and the first well region 2 are present. When a negative voltage surge occurs and turns ON the first parasitic diode PD1 and the second parasitic diode PD2, current attempts to flow to the first parasitic diode PD1 and the second parasitic diode PD2 along current paths on the upper surface side and bottom surface side of the semiconductor integrated circuit 40a.

In FIG. 7, a first path R1, a second path R2, and a third path R3 are respectively indicated by dashed lines as current paths that do not pass through the rear surface electrode layer 11. On the first path R1, current flows from the GND terminal 46 on the substrate surface through a wire made of metal or the like and then arrives at the first parasitic diode PD1.

On the second path R2, current flows from the second isolation region 6 side through the semiconductor substrate 1 and the first isolation region 5 and then arrives at the first parasitic diode PD1. On the third path R3, current flows from the first isolation region 5 side through the region of the semiconductor substrate 1 beneath the breakdown voltage region 4 and then arrives at the first well region 2. When a negative voltage surge occurs, non-zero currents flow along the first to third paths R1 to R3 that do not pass through the rear surface electrode layer 11.

Figure 8:
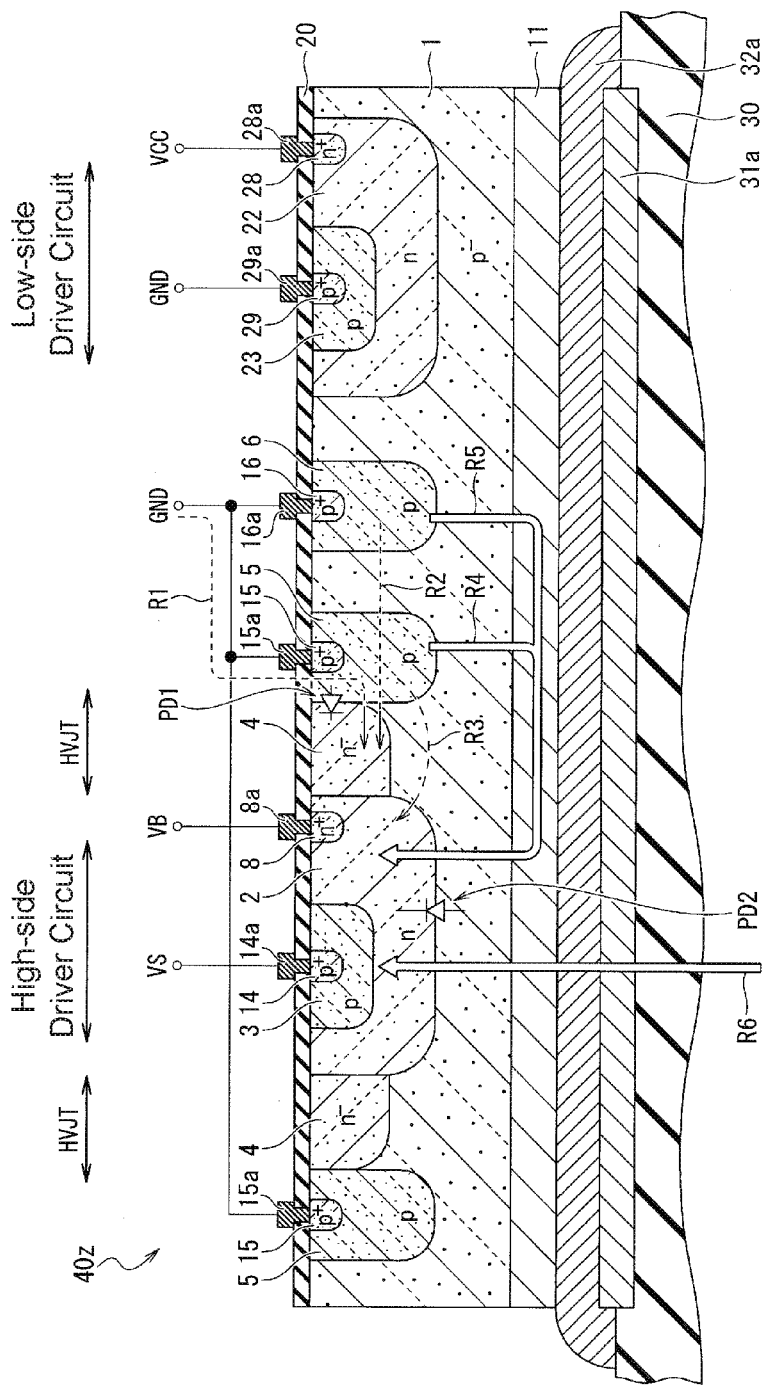
FIG. 8 is a cross-sectional view for explaining the flow of current through a parasitic element in a semiconductor integrated circuit according to a comparison example.

Meanwhile, in FIG. 7, a fourth path R4, a fifth path R5, and a sixth path R6 are respectively indicated by white block arrows as current paths that do pass through the rear surface electrode layer 11. As illustrated in FIG. 8, the fourth path R4 is a path along which, when the insulating layer 10 is not present, current flows from the p-type first isolation region 5 side through the semiconductor substrate 1 and the rear surface electrode layer 11 (which has a lower resistance than the surroundings) and then arrives at the second parasitic diode PD2.

Similar to the fourth path R4, the fifth path R5 is also a path along which, when the insulating layer 10 is not present, current flows from the p-type second isolation region 6 side through the semiconductor substrate 1 and the rear surface electrode layer 11 (which has a lower resistance than the surroundings) and then arrives at the second parasitic diode PD2. The sixth path R6 is a path along which, when the insulating layer 10 is not present, current flows from the insulated circuit board 30 side through the rear surface electrode layer 11 and then arrives at the second parasitic diode PD2. As illustrated in FIG. 7, the insulating layer 10 is formed midway through each of the fourth path R4, the fifth path R5, and the sixth path R6, thereby reducing the amount of current that flows through the rear surface electrode layer 11 due to negative voltage surges.

Comparison Example

Meanwhile, as illustrated in FIG. 8, in a semiconductor integrated circuit 40z according to a comparison example, the insulating layer 10 is not formed between the semiconductor substrate 1 and the rear surface electrode layer 11. Therefore, when the magnitude of a negative voltage surge is large, the first parasitic diode PD1 and the second parasitic diode PD2 turn ON, and large currents flow from the GND terminal 46 side to the VB terminal 44 side along the fourth path R4, the fifth path R5, and the sixth path R6.

FIG. 8 illustrates how the current that flows from the first isolation region 5 side along the fourth path R4 and the current that flows from the second isolation region 6 side along the fifth path R5 pass through the rear surface electrode layer 11 (which has a lower resistance than the surroundings) and then both arrive at the second parasitic diode PD2. Moreover, the current that flows from the insulated circuit board 30 side along the sixth path R6 passes through the rear surface electrode layer 11 and then arrives at the second parasitic diode PD2.

When large surge currents flow in this manner, a parasitic transistor and a parasitic thyristor that are structurally formed within the high-side driver circuit turn ON, which can potentially cause the circuit to malfunction or suffer localized damage. Moreover, these surge currents can also potentially flow to the low-side driver circuit of the semiconductor integrated circuit 40z and thereby cause the low-side driver circuit to malfunction or suffer damage as well.

In the semiconductor integrated circuit 40a according to the embodiment of the present invention, the insulating layer 10 is formed between the semiconductor substrate 1 and the rear surface electrode layer 11, thereby making it possible to reduce the amount of current that flows through the rear surface electrode layer 11 due to negative voltage surges. Moreover, the rear surface electrode layer 11 that functions as a buffer for improving the adhesion between the insulating layer 10 and the bonding layer 32a is also formed, thereby increasing bond integrity when the HVIC is mounted on the insulated circuit board 30. This makes it possible to provide a highly reliable semiconductor integrated circuit 40a that exhibits high noise tolerance and reduced susceptibility to circuit malfunctions and damage while also making it possible to increase bond integrity when a module is formed.

As the surge currents induced by negative voltage surges increase in magnitude, the resulting problems that occur in the circuits become increasingly severe. In particular, parasitic elements formed in the vertical direction of the substrate (such as the second parasitic diode PD2 illustrated in FIG. 7) have a relatively large area and are more likely to allow large currents to flow. In the semiconductor integrated circuit 40a according to the embodiment of the present invention, the insulating layer 10 is formed at a position directly beneath the high-side driver circuit, thereby reliably reducing activation of the parasitic element formed in the vertical direction of the substrate and making it possible to reduce the severity of any problems that can potentially occur.

Moreover, if the voltage relationship VB<VS is satisfied due to a surge or the like while the conductor layer patterns in the insulated circuit board 30 are wired to GND, a parasitic PNP transistor in which the second well region 3 is the emitter, the first well region 2 is the base, and the semiconductor substrate 1 is the collector turns ON. Therefore, a large current flows in the vertical direction of the substrate in the high-side driver circuit, which can potentially damage the HVIC.

However, in the semiconductor integrated circuit 40a according to the embodiment of the present invention, the insulating layer 10 reduces the amount of current that flows in the vertical direction of the substrate, and the resistance of the substrate itself restrains the flow of current to the horizontal direction of the substrate. In other words, the resistance of the collector in the parasitic PNP transistor is increased, thereby making it possible to effectively prevent damage to the HVIC when the voltage relationship VB<VS is satisfied.

Furthermore, even when the insulating layer 10 is not formed, negative voltage surge resistance can be improved by means of layout adjustments such as arranging the high-side driver circuit farther away from the HVJT or forming a GND pickup between the HVJT and the low-side driver circuit, for example. However, these solutions introduce additional complexities such as more complicated layout rules and an increased number of layout restrictions. In the semiconductor integrated circuit 40a according to the embodiment of the present invention, forming the insulating layer 10 between the semiconductor substrate 1 and the rear surface electrode layer 11 makes it possible to improve the negative voltage surge resistance, thereby removing the need to make changes to the existing surface structure layout of the semiconductor substrate 1.

In addition, as illustrated in FIG. 5, the semiconductor integrated circuit 40a according to the embodiment of the present invention makes it possible to bond the semiconductor integrated circuit 40a to the insulated circuit board 30 at the same height as the switching element S1 and the freewheeling diode FWD1. Moreover, using the rear surface electrode layer 11 as a buffer makes it possible to use solder for the bonding layer 32a, thereby making it possible to utilize the same soldering process used for components such as the switching element 51 and the freewheeling diode FWD1.

Soldering processes exhibit good compatibility with circuit patterns in which a material such as Al that is highly versatile in mounting processes is used as the conductive layer. In other words, this facilitates standardization of the mounting process for the semiconductor integrated circuit 40a and the mounting processes for components such as the switching elements S1 to S6, thereby making it possible to eliminate unnecessary bonding steps and improve overall manufacturing efficiency.

Furthermore, the insulating layer 10 of the semiconductor integrated circuit 40a according to the embodiment of the present invention may be implemented using a silicon on insulator (SOI) substrate or a standard Si semiconductor substrate 1. Here, however, it is preferable that the insulating layer 10 be formed on the rear surface of a standard semiconductor substrate 1 using a conventional film formation technology because this approach is less expensive than using an SOI substrate.

Moreover, when using an SOI substrate to manufacture an HVIC for use as a high-voltage power IC in 600V applications and above, for example, a buried insulating film (BOX) of a relatively large thickness (approximately 5 µm) is required. This makes the substrate significantly more prone to warping, which can potentially cause problems such as alignment defects and focusing errors in the method of manufacturing the semiconductor integrated circuit 40a.

Furthermore, SOI substrates must typically be purpose-designed in advance in order to be able to achieve the target breakdown voltage for the semiconductor substrate 1 in a state in which the depletion layer reaches the buried insulating film (that is, in a state in which the full breakdown voltage is applied to the buried insulating film). Therefore, forming the insulating layer 10 on a standard semiconductor substrate 1 that does not have to bear the full breakdown voltage is advantageous both in terms of increasing substrate strength and in terms of the insulating layer 10 offering a simpler surge current prevention solution.

Other Embodiments

Although the present invention was described with reference to the embodiment as described above, the descriptions or drawings in this disclosure should not be understood to limit the present invention in any way. It should instead be understood that various alternative embodiments, examples, and applied technologies based on this disclosure would be obvious to a person skilled in the art.

For example, although an Si semiconductor substrate 1 was used for the semiconductor substrate 1 in the semiconductor integrated circuit 40a and 40z illustrated in FIGS. 1 to 8, the present invention is not limited to this example, and a semiconductor substrate 1 made of a wide-bandgap semiconductor such as SiC or GaN may be used instead. Moreover, although the power switching elements S1 to S6 illustrated in FIG. 4 were IGBTs as an example, these switching elements are not limited to being IGBTs and may instead be another type of power switching element such as MOSFETs.

Furthermore, although the insulating layer 10 is formed over the entire rear surface of the semiconductor substrate 1 in the semiconductor integrated circuit 40a according to the embodiment of the present invention as illustrated in FIG. 1, the present invention is not limited to this example, and the insulating layer 10 may instead be formed just on a region of the rear surface of the semiconductor substrate 1 that is directly beneath the high-side driver circuit. The insulating layer 10 does not necessarily need to be formed beneath the HVJT or beneath the low-side driver circuit that are respectively positioned on the left and right ends of FIG. 1. As described in reference to FIG. 7, it is preferable that the insulating layer 10 be formed at least on a region of the rear surface of the semiconductor substrate 1 that is directly beneath the high-side driver circuit in order to make it possible to prevent the flow of current directly beneath the high-side driver along the surge current paths that lead to the parasitic element between the semiconductor substrate 1 and the first well region 2.

In addition, although the rear surface electrode layer 11 according to the embodiment of the present invention was described as being a multilayer Al/Ti/Ni/Au layer, the present invention is not limited to this example, and the rear surface electrode layer 11 may instead be formed as a single-layer structure that only includes a Ti layer, for example. Moreover, the rear surface electrode layer 11 is not limited to having a three-layer structure or a four-layer structure and may instead have a two-layer structure constituted by a TiN layer or the like or have a structure that includes five or more layers, for example. Furthermore, Al is not necessarily a required material in the rear surface electrode layer 11. It is preferable that the materials included in the rear surface electrode layer 11 be selected in consideration of the adhesion and bondability between the upper side of the rear surface electrode layer 11 and the insulating layer 10 that is bonded thereto.

As described above, the present invention includes various other embodiments and the like that are not explicitly described above. In addition, the technical scope of the present invention is defined only by the characterizing features of the invention according to the claims, which are derived as appropriate from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
   a semiconductor integrated circuit including:
      a semiconductor substrate of a first conductivity type;
      a first well region of a second conductivity type formed in an upper portion of the semiconductor substrate;
      a second well region of the first conductivity type formed in an upper portion of the first well region;
      an insulating layer formed separated from the first well region on a bottom portion of the semiconductor substrate directly beneath the first well region; and
      a rear surface electrode layer formed below the insulating layer;
   an insulated circuit board having formed on a surface thereof a conductive layer on which to mount the semiconductor integrated circuit;
   a bonding layer that is interposed between the conductive layer and the rear surface electrode layer and bonds together the rear surface electrode layer and the conductive layer;
   a first active element including a first main electrode region and a second main electrode region both of the first conductivity type and formed in an upper portion of the first well region;
   a second active element including a third main electrode region and a fourth main electrode region both of the second conductivity type and formed in an upper portion of the second well region; and
   a switching element that is mounted on the insulated circuit board and controlled by the first active element and the second active element.

2. The semiconductor module according to claim 1, wherein the semiconductor integrated circuit and the switching element are mounted at a same height.

3. The semiconductor module according to claim 1,
   wherein a first voltage is applied to the first well region, and
   wherein a second voltage that is different from the first voltage is applied to the second well region.

4. The semiconductor module according to claim 3, wherein a distance between the first well region and the insulating layer is set such that, when the first voltage is applied to the first well region and the second voltage is applied to the second well region, a depletion layer that expands out from a p-n junction between the semiconductor substrate and the first well region is separated from the insulating layer.

5. The semiconductor module according to claim 1, further comprising:
   an isolation region of the first conductivity type that is formed separated from the first well region in an upper portion of the semiconductor substrate and to which a reference voltage is applied.

6. The semiconductor module according to claim 5, further comprising:
   a breakdown voltage region of the second conductivity type formed in an upper portion of the semiconductor substrate between the first well region and the isolation region.

* * * * *